(12) United States Patent
Park

(10) Patent No.: US 8,369,181 B2
(45) Date of Patent: Feb. 5, 2013

(54) SEMICONDUCTOR INTEGRATED CIRCUIT DEVICE FOR CONTROLLING A SENSE AMPLIFIER

(75) Inventor: Sun Hwa Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/340,812

(22) Filed: Dec. 30, 2011

(65) Prior Publication Data

US 2012/0092936 A1   Apr. 19, 2012

Related U.S. Application Data

(62) Division of application No. 12/345,665, filed on Dec. 30, 2008, now Pat. No. 8,107,302.

(30) Foreign Application Priority Data

Aug. 8, 2008   (KR) .................. 10-2008-0077702

(51) Int. Cl.
    *G11C 7/00*   (2006.01)

(52) U.S. Cl. ............... 365/233.17; 365/230.06; 365/194; 365/191

(58) Field of Classification Search ............. 365/233.17, 365/230.06, 194, 191
See application file for complete search history.

(56) References Cited

U.S. PATENT DOCUMENTS

| 2004/0165452 A1* | 8/2004 | Nakano ........................ 365/193 |
| 2007/0002648 A1* | 1/2007 | Ikeda et al. .................. 365/201 |
| 2009/0040851 A1* | 2/2009 | Mori et al. ................... 365/201 |

* cited by examiner

*Primary Examiner* — Vu Le
*Assistant Examiner* — Han Yang
(74) *Attorney, Agent, or Firm* — William Park & Associates Ltd.

(57) ABSTRACT

A semiconductor IC device includes a command decoder that provides internal read and internal write command signals in response to external command signals, and a delay control unit that is connected with the command decoder and provides an internal read command delay signal by controlling an activation timing of the internal read command signal in response to a test mode signal in a read mode.

5 Claims, 4 Drawing Sheets

SEMICONDUCTOR INTEGRATED CIRCUIT DEVICE FOR CONTROLLING A SENSE AMPLIFIER

CROSS REFERENCE TO RELATED APPLICATION

The present application claims priority under 35 U.S.C. §119(a) to Korean application number 10-2008-0077702, filed on Aug. 8, 2008, in the Korean Intellectual Property Office, which is incorporated herein by reference in its entirety as if set forth in full.

BACKGROUND

1. Technical Field

The embodiments described herein relate to a semiconductor integrated circuit (IC) device, and more particularly, to a semiconductor IC device for controlling a sense amplifier.

2. Related Art

In general, predetermined time rules are applied when reading or writing data in response to an external read command or an external write command. For example, a time interval from an external active command to a read command (or write command) is set as a time tRCD, i.e., a RAS to CAS time delay. With respect to an address, the tRCD can be considered as a time rule from when a row address is input to when a column address is input, which is a time rule at a system level for signals provided in synchronization with external clock signals. Here, a delay time exists from when a corresponding bit line selection signal is activated to after a row address is input. It is important to activate a bit line selection signal at an appropriate time in order to accurately read or write data.

On the other hand, in a DRAM circuit, accurate operation of a sense amplifier is more important for reading than writing, but controlling the operation of a conventional sense amplifier is difficult. Accordingly, timing and control of tRCD-related circuits are adjusted by testing whether or not a tRCD margin is satisfied during a reading operation. However, it is difficult to perform the test while changing the activation timing of control signals of the related circuits in order to adjust the tRCD.

SUMMARY

A semiconductor IC device that controls an output timing of a column main single to adjust a tRCD using a test mode is described herein.

In one aspect, a semiconductor IC device includes a command decoder that provides internal read and internal write command signals in response to external command signals, and a delay control unit that is connected with the command decoder and provides an internal read command delay signal by controlling an activation timing of the internal read command signal in response to a test mode signal in a read mode. In another aspect, a semiconductor IC device includes a column signal generating block configured to receive a column command, provide a column main signal, and control an activation timing of the column main signal according to an internal read command signal and a test mode signal.

In still another aspect, a semiconductor IC device includes a core circuit block that includes a bit line sense amplifier that senses a phase difference between a word line and a pair of bit line connected with the word line, and a periphery circuit block that controls a sensing timing of the sense amplifier by controlling an activation timing of an internal read command signal according to a test mode signal when reading data to provide a column main control signal with delay adjusted.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
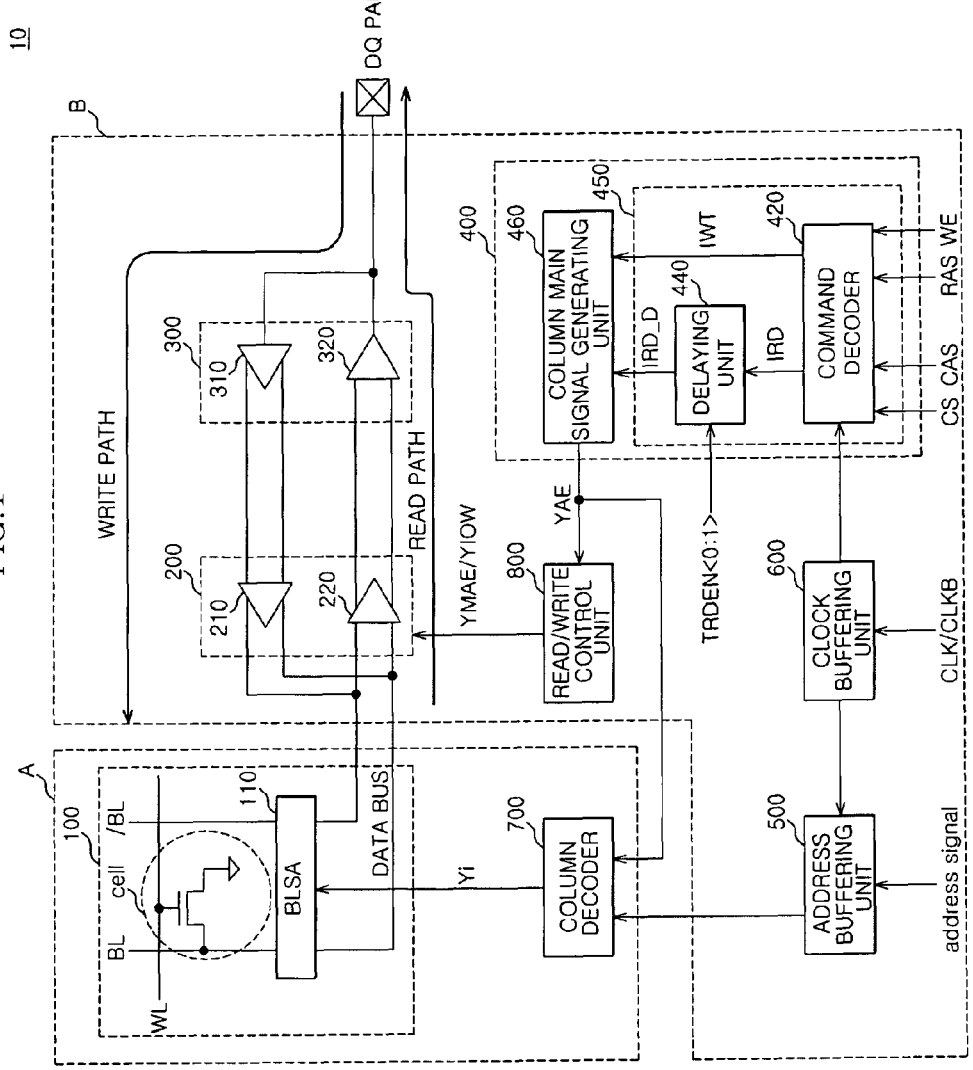
FIG. 1 is a schematic block diagram of an exemplary semiconductor IC device according to one embodiment.

FIG. 1 is a schematic block diagram of an exemplary semiconductor IC device 10 according to one embodiment. In FIG. 1, a semiconductor IC device 10 can be configured to include a core circuit block A and a periphery circuit block B.

The core circuit block A can include a memory region 100 and a column decoder 700. For example, the core circuit block A can include a circuit block having a memory cell array, a bit line sense amplifier, a column decoder, and a row decoder. The row decoder is not shown herein for convenience of explanation.

The periphery circuit block B can include a data signal amplifying unit 200, a data input/output buffering unit 300, a column signal generating block 400, an address buffering unit 500, a clock buffering unit 600, and a write/read control unit 800. The periphery circuit block B can function as a control circuit block that allows data at a stable level to be read or written to the core circuit block A in a read or write mode.

In FIG. 1, the memory region 100 can include a region where data is read or written by an external command, including a plurality of memory cells. Although the memory region 100 is shown to have one unit memory cell, a plurality of unit memory cells can be included. Accordingly, data stored in a cell connected to a word line WL selected by a read command can be loaded through a pair of bit lines BL and /BL, and then amplified and output by a bit line sense amplifier BLSA. Alternatively, the bit line sense amplifier BLSA can sense data transmitted from the outside by a write command, and can store the data in a cell through the pair of bit lines BL and /BL. The sensing timing of the bit line sense amplifier BLSA can be controlled by a bit line selection signal 'Yi'.

The column decoder 700 can decode a column address (not shown) and provide a bit line selection signal 'Yi' to the memory region 100 when a column main signal 'YAE' is activated. Here, the column address (not shown) can be input when a column command is activated. Accordingly, the column decoder 700 can select a corresponding bit line selection signal 'Yi' by decoding an input column command, such as a read or write command. However, the output timing can be controlled by a column main signal 'YAE' that can be a driving reference of a column.

In FIG. 1, the data input/output buffering unit 300 of the periphery circuit block B can transmit/receive data from a data input/output pad DQ PAD, and can buffer input data or output data. For example, the data input/output buffering unit 300 can include an input buffer 310 and an output buffer 320.

The data signal amplifying unit 200 can include a write driver 210 and a main sense amplifier 220. The write driver 210 can load buffered input data to a data bus to write the buffered input data to the memory region 100. The main sense amplifier 220 can re-sense the data signal loaded to the data bus from the memory region 100 and can provide the data signal as a signal at a stable level to the output buffer 320. In addition, the operation of the data signal amplifying unit 200 can be controlled by output and input control signals 'YMAE' and 'YIOW' provided from the write/read control unit 800.

The write/read control unit 800 can be controlled by a column main signal 'YAE' and can activate an input control signal 'YIOW' and/or an output control signal 'YMAE'. Here, the input control signal 'YIOW' can control the operation of the write driver 210 during a writing operation, or the output control signal YMAE can control the operation of the main sense amplifier 220 during a reading operation, both at a predetermined timing. For example, the column main signal 'YAE' is an important reference signal that can drive the circuit blocks of the column. Thus, the timing for activating the signal can be an important factor for controlling a timing for driving other column circuit blocks.

The column signal generating block 400 can provide a column main signal 'YAE' with an adjusted activation timing in response to a test mode signal '(TRDEN<0:1>)', when receiving a column command. For example, the column signal generating block 400 can tune a timing margin of the tRCD by adjusting the activation timing of the column main signal 'YAE', which is a reference for driving the bit line sense amplifier BLSA, particularly in a read mode.

In FIG. 1, the column signal generating block 400 can be configured to include a column signal control section 450 and a column main signal generating unit 460. The column signal control section 450 can include a command decoder 420 and a delay control unit 440.

The command decoder 420 can provide an internal read command signal 'IRD' and an internal write command signal 'IWT' in response to external command control signals 'RAS', 'CAS', 'WE', and 'CS'. For example, the command decoder 420 can provide an activated internal read command signal 'IRD' in the read mode and can provide an activated internal write command signal 'IWT' in the write mode. The delay control unit 440 can provide an internal read command delay signal 'IRD_D' by adjusting the delay times of the internal read command signal 'IRD' to be different according to the test mode signal 'TRDEN<0:1>'. In addition, the column main signal generating unit 460 can provide a column main signal 'YAE' in response to the internal write command signal 'IWT' without delay adjustment in the write mode. However, in the read mode, the column main signal generating unit 460 can provide a column main signal 'YAE' in response to the internal read command delay signal 'IRD_D'.

The address buffering unit 500 and the clock buffering unit 600 can have substantially the same function as common buffering units. For example, the clock buffering unit 600 can buffer external clock signals 'CLK' and '/CLK', and can provide them to the address buffering unit 500 and the column signal generating block 400. The address buffering unit 500 can buffer column address signals in response to the clock signals 'CLK' and '/CLK', and can provide them to the column decoder 700 when a column command is activated. Although not shown, the address buffering unit 500 can also buffer row address signals and provide them to the row decoder (not shown) when an active command is activated.

Exemplary read and write operations will be described with reference to FIG. 1.

In the read mode, the command decoder 420 can activate an internal read command signal 'IRD'. An internal read command delay signal 'IRD_D' can be provided by delaying the internal read command 'IRD' for a predetermined time using a test mode signal 'TRDEN<0:1>'. Accordingly, a column main signal 'YAE' can be activated at a predetermined delay time. In addition, a bit line selection signal 'Yi' can drive a corresponding pair of bit lines BL and /BL through the column decoder 700 by receiving an external address from the address buffering unit 500. In this operation, the activation timing of the bit line selection signal 'Yi' can be delayed in response to the delayed column main signal 'YAE'. Thus, the sensed data of the bit line sense amplifier BLSA can be selected by the delayed bit line selection signal 'Yi', and can then be provided to the external data input/output pad DQ PAD through the data bus and a series of data paths (refer to a read path), including the main sense amplifier 220 and the output buffer 320.

In the write mode, the command decoder 420 can activate an internal write command signal 'IWT'. The internal write command signal IWT is not delayed, and can be provide by itself as a column main signal 'YAE'. In addition, data input through a series of data input path (refer to a write path) including the input buffer 310 and the write driver 210 can be loaded to the data bus. Accordingly, data written to the bit line sense amplifier BLSA can be transmitted to the pair of bit lines BL and /BL by a bit line selection signal and then stored in the cell connected to an activated word line WL.

The read and write operations can perform stable transmission of data to/from the pair of bit lines BL and /BL when the bit line selection signal 'Yi' is activated. Thus, the appropriate activation timing of the bit line selection signal 'Yi' is a critical factor in determining whether or not the read or write operation fails. However, in the read mode, it is possible to adjust the delay time of a column main signal 'YAE' according to the test mode signal 'TRDEN<0:1>'. Accordingly, the activating timing of a bit line selection signal 'Yi' can be adjusted in response to the column main signal 'YAE' with the delay time adjusted. Thus, the sensing timing of the bit line sense amplifier BLSA can be adjusted, such that a stable tRCD margin can be ensured.

Figure 2:
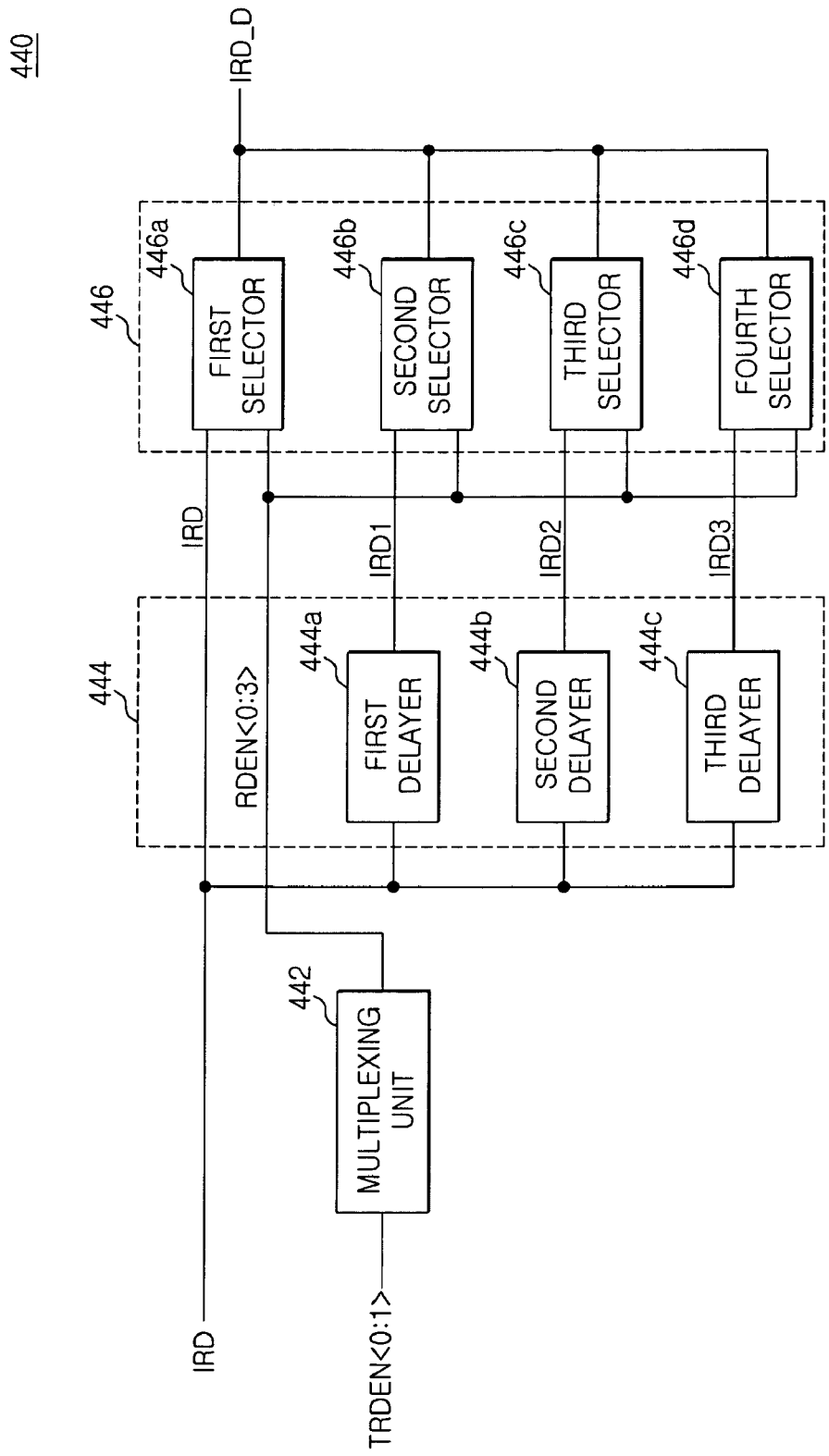
FIG. 2 is a schematic block diagram of an exemplary delay control unit capable of being implemented in the device of FIG. 1 according to one embodiment.
Figure 3:
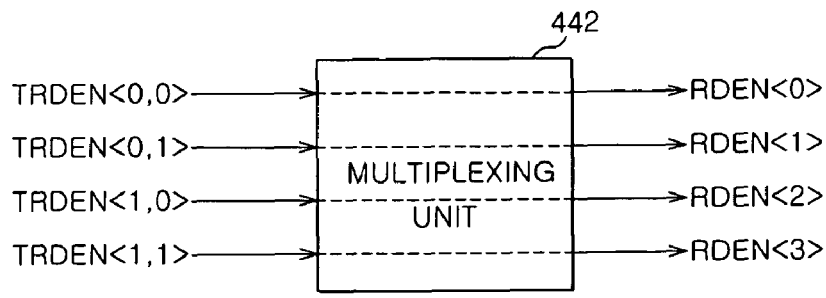
FIG. 3 is a schematic block diagram of an exemplary multiplexing unit capable of being implemented in the device of FIG. 1 according to one embodiment.

FIG. 2 is a schematic block diagram of an exemplary delay control unit 440 capable of being implemented in the device 10 of FIG. 1 according to one embodiment, and FIG. 3 is a schematic block diagram of an exemplary multiplexing unit 442 capable of being implemented in the device 10 of FIG. 1 according to one embodiment. In FIGS. 2 and 3, the delay control unit 440 can be configured to include the multiplexing unit 442, a delaying unit 444, and a selecting unit 446.

The multiplexing unit 442 (in FIG. 3) can decode the test mode signal 'TRDEN<0:1>', and can provide first to fourth read control signals 'RDEN<0:3>'. For example, the multiplexing unit 442 can provide an activated first read control signal 'RDEN<0>' when receiving combination of test mode signal 'TRDEN<0,1>'. In addition, the multiplexing unit 442 can provide an activated second read control signal 'RDEN<1>' when receiving combination of test mode signal 'TRDEN<0,1>'. Accordingly, the multiplexing unit 442 can activate a corresponding read control signal 'RDEN<0:3>' by decoding the test mode signal 'TRDEN<0:1>'.

The delaying unit 444 can receive the internal read command signals 'IRD', and can adjust the timing thereof to have different delay times. Accordingly, the delaying unit 444 can include first to third delayer 444a, 444b, 444c, each having different delay times. For example, the first delayer 444a can receive the internal read command signal 'IRD', and can provide a first delay signal 'IRD1' by delaying the internal read command signal 'IRD' a predetermined time. Similarly, the second delayer 444b can receive the internal read command signal 'IRD', and can provide a second delay signal 'IRD2' by delaying the internal read command signal 'IRD' a predetermine time, which is different from the first delayer 444a. Likewise, the third delayer 444c can receive the internal read command signal 'IRD', and can provide a third delay signal 'IRD3' by delaying the internal read command signal 'IRD' a predetermined time, which is different from the first and second delayers 444a and 444b. As a result, the delaying unit 444 can provide first to third delay signals 'IRD1' to 'IRD3' each having different delay times using internal read command signals 'IRD'.

The selecting unit 446 can transmit the internal command signals 'IRD' or first to third delay signals 'IRD1' to 'IRD3' with delay times adjusted as internal read command delay signals 'IRD_D' in response to first to fourth read control signals 'RDEN<0:3>'. Accordingly, the selecting unit 446 can include first to fourth selectors 446a to 446d. The first to fourth selectors 446a to 446d can be driven in response to first to fourth read control signals 'RDEN<0:3>', respectively. Thus, the first to fourth selectors 446a to 446d can control whether or not to transmit internal command signals 'IRD' or first to third delay signals 'IRD1' to 'IRD3' with adjusted delay times. For example, the first selector 446a can provide an internal read command signal 'IRD' as an internal read command delay signal 'IRD_D' in response to an activated first read control signal 'RDEN<0>'. Here, the internal read command delay signal 'IRD_D' that is an output signal of the first selector 446a may be substantially the same signal as an internal read command signal 'IRD' of which delay is not adjusted. The second to fourth selectors 446b to 446d can provide first to third delay signals 'IRD1' to 'IRD3' as internal read command delay signals 'IRD_D' in response to activated second to fourth read control signals 'RDEN<1:3>', respectively. Thus, the internal read command delay signals 'IRD_D' output by the second to fourth selectors 446b to 446d can be signals with different adjusted delay times.

Figure 4:
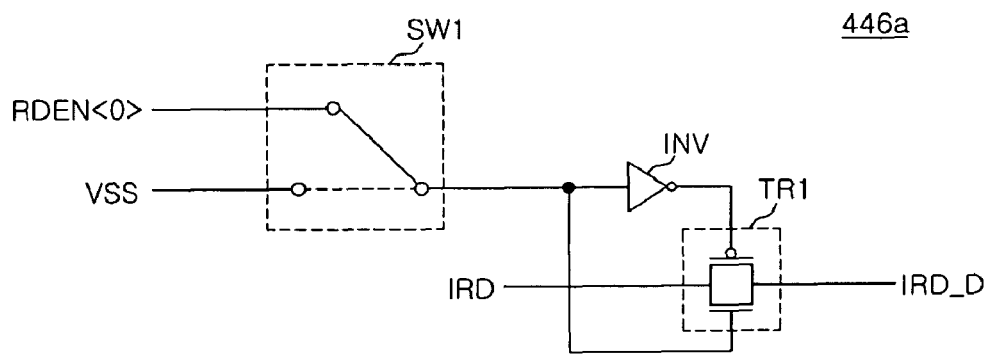
FIG. 4 is a schematic circuit diagram of an exemplary first selector capable of being implemented in the unit of FIG. 2 according to one embodiment.

FIG. 4 is a schematic circuit diagram of an exemplary first selector 446a capable of being implemented in the unit of FIG. 2 according to one embodiment. In FIG. 4, the first selector 446a can include a first switch SW1 and a first transmitting gate TR1.

The first switch SW1 can have two input terminals to receive a first read control signal 'RDEN<0>' and a grounding power source VSS. Accordingly, the first switch SW1 can be connected to receive a first read control signal 'RDEN<0>' in a test mode, and can be connected to receive a signal at a fixed level of the grounding power source VSS after it is verified through the test mode. Accordingly, the first transmitting gate TR1 can be turned ON in response to an activated first read control signal 'RDEN<0>', and can provide an internal read command signal 'IRD' as an internal read command delay signal 'IRD_D'.

Since the first selector 446a can functions as a circuit for controlling whether or not to transmit an internal read command signal 'IRD', which is not an adjusted delay signal, is the first selector 446a can be connected with the grounding power source VSS if it is determined that the delay adjustment is required after the test mode. Accordingly, when the delay adjustment is needed, the internal read command signal 'IRD' itself can be prevented from being transmitting as the internal read command delay signal 'IRD_D' through the first selector 446a.

Figure 5:
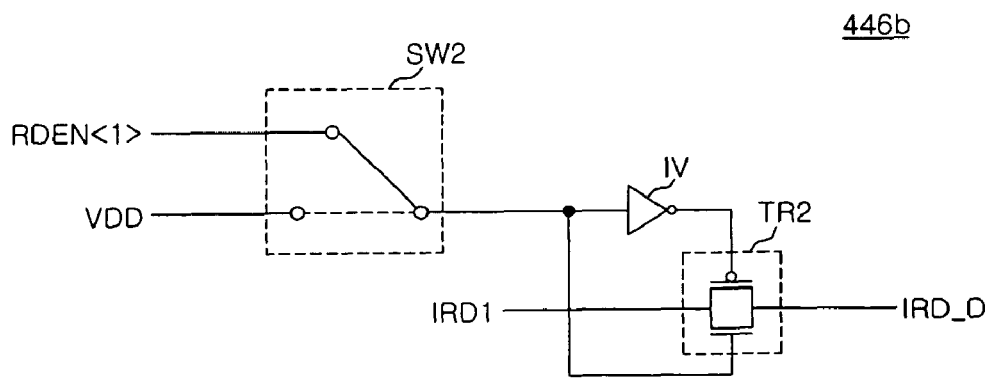
FIG. 5 is a schematic circuit diagram of an exemplary second selector capable of being implemented in the unit of FIG. 2 according to one embodiment.

FIG. 5 is a schematic circuit diagram of an exemplary second selector 446b capable of being implemented in the unit of FIG. 2 according to one embodiment. In FIG. 5, the second selector 446b can include a second switch SW2 and a second transmitting gate TR2.

The second switch SW2 can have two input terminals to receive a second read control signal 'RDEN<1>', and an external power supply VDD. Accordingly, the second switch SW2 can be connected to receive a second read control signal 'RDEN<1>' in the test mode, and can be connected to receive a signal at a fixed level of the external power supply VDD if an internal read command delay signal 'IRD_D' delayed as much as corresponding time is needed after it is verified through the test mode.

The second transmitting gate TR2 can be turned ON in response to an activated second read control signal 'RDEN<1>', and can provide a first delay signal 'IRD1' obtained by delaying an internal read command signal 'IRD' for a predetermined time by the first delayer 444a (in FIG. 2) as an internal read command delay signal 'IRD_D'.

For purposes of brevity, only the second selector 446a will be described. However, the third and the fourth selectors 446c and 446d can have substantially the same configuration and principles of operation, whereas receiving signals can be different. Accordingly, when it is determined that the delay adjustment for a predetermined time is needed after the test mode, the switches of the selectors 446b to 446d (in FIG. 2) connected with corresponding delayers can be connected to the external power supply VDD. In addition, more test mode signals, delayers, and selectors can be provided for more accurate delay time adjustment.

Figure 6:
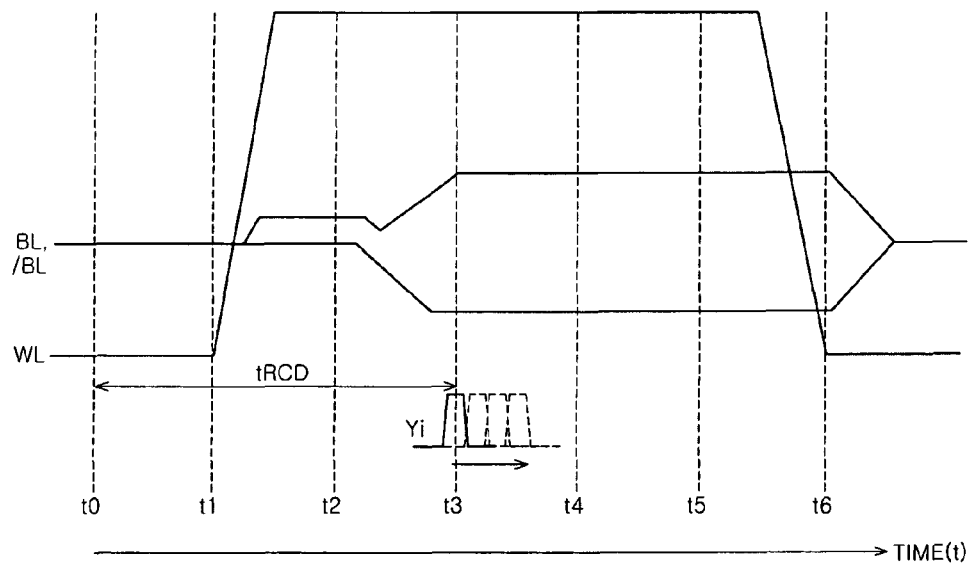
FIG. 6 is a timing diagram demonstrating adjustment of sensing timing of a bit line sense amplifier of the device of FIG. 1 according to one embodiment.

FIG. 6 is a timing diagram demonstrating adjustment of sensing timing of a bit line sense amplifier of the device of FIG. 1 according to one embodiment.

Referring to FIGS. 1 to 6, the section t0 to t1 is a section where active commands are activated. Accordingly, in the time section t1 to t2, a word line WL is ready to be activated and a pair of bit lines BL and /BL is unequalized.

The time section t2 to t3 is a section where column commands, i.e., a read command, are activated. Accordingly, the pair of bit lines BL and /BL start to sense.

Meanwhile, a column main signal 'YAE' can be generated in response to a column command, and a bit line selection signal 'Yi' can be activated. When reading data in response to the bit line selection signal 'Yi', adjustment of delay time may not be needed unless the read operation fails. However, when the read operation fails, the bit line selection signal 'Yi' can be delayed further to read data at a stable level. Accordingly, the delay time of the column main signal 'YAE' can be adjusted using the test mode signal 'TRDEN<0:1>', and the activation timing of the bit line selection signal 'Yi' can be adjusted in response to the adjustment (refer to the dotted line).

Reading data continues to the time section t4 to t5. Here, data sensed by the bit line sense amplifier BLSA can be re-amplified by the main sense amplifier 220 through the data bus.

Next, when a precharge command is active in the time section t5 to t6, the word line WL can be inactivated after the time t6 and the pair of bit lines BL and /BL can start to be equalized. In this process, the data amplified by the main sense amplifier 220 can be provided to the data input/output pad DQ PAD through the circuits in the read path.

The interval from the section where the active commands are activated to the section where the read command is activated is defined as the tRCD. However, this is a time set as a clock base by an external system, and where or not to satisfy the time can be determined by whether or not the operation of the internal circuit fails. Since the operation of the internal circuit is an asynchronous operation, the main signal, which is a reference signal, and related control signals are not signals that are synchronized with clock signals. Accordingly, by changing the activation timing of the column main signal, it is possible to change the activation timings of signals related to corresponding circuits to be the same. As described above, by appropriately adjusting the activation timing of the column main signal 'YAE', it is possible to adjust the activation timing of a related bit line selection signal 'Yi'. Thus, it is possible to the satisfy the tRCD of a semiconductor IC device using a simple test mode.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

The invention claimed is:

1. A semiconductor IC device, comprising:
    a command decoder configured to provide internal read and internal write command signals in response to external command signals; and
    a delay control unit that is connected with the command decoder and configured to provide an internal read command delay signal by controlling an activation timing of the internal read command signal according to a result of decoding a test mode signal in a read mode.

2. The semiconductor IC device of claim 1, wherein the delay control unit includes:
    a multiplexing unit configured to provide a plurality of read control signals based on the test mode signal;
    a delaying unit configured to receive the internal read command signal and produce a plurality of internal read command delay signals with different delay times based on the internal read command signal and the plurality of read control signals; and
    a selecting unit connected with the delaying unit and configured to transmit one of the plurality of internal read command delay signals in response to the read control signals.

3. The semiconductor IC device of claim 2, wherein the delay unit includes a plurality of delayers, each having different delay times and configured to provide one of the plurality of internal read command delay signals.

4. The semiconductor IC device of claim 2, wherein the selecting unit includes a plurality of selectors, and wherein each of the plurality of selectors configured to control whether or not transmit one of the plurality of internal read command delay signals produced by the delay unit based in a corresponding activated read control signal.

5. The semiconductor IC device of claim 4, wherein each of the selectors further includes a switch configured to receive the read control signal in a test mode, receive a signal at a fixed level, and control whether or not to transmit one of the plurality of internal read command delay signals after being verified in the test mode.

* * * * *